United States Patent [19]

Lin et al.

[11] Patent Number: 6,046,087
[45] Date of Patent: Apr. 4, 2000

[54] FABRICATION OF ESD PROTECTION DEVICE USING A GATE AS A SILICIDE BLOCKING MASK FOR A DRAIN REGION

[75] Inventors: Geeng-Lih Lin; Ming-Dou Ker, both of Hsinchu, Taiwan

[73] Assignee: Vanguard International Semiconductor Corporation, Hsin-Chu, Taiwan

[21] Appl. No.: 09/247,792

[22] Filed: Feb. 10, 1999

[51] Int. Cl.[7] .................. H01L 21/336; H01L 21/425
[52] U.S. Cl. .................. 438/279; 438/281; 438/305; 438/307; 438/529
[58] Field of Search ................... 438/279, 281, 438/305, 307, 529

[56] References Cited

U.S. PATENT DOCUMENTS

| | | |
|---|---|---|
| 4,753,897 | 6/1988 | Lund et al. . |
| 5,021,853 | 6/1991 | Mistry ................... 357/23.13 |
| 5,272,097 | 12/1993 | Shiota ..................... 437/34 |
| 5,440,162 | 8/1995 | Worley et al. ............ 257/355 |
| 5,446,302 | 8/1995 | Beigel et al. ............. 257/355 |
| 5,477,413 | 12/1995 | Watt ....................... 361/56 |
| 5,612,242 | 3/1997 | Hsu . |
| 5,629,544 | 5/1997 | Voldman et al. .......... 257/355 |
| 5,646,062 | 7/1997 | Yuan et al. . |
| 5,719,733 | 2/1998 | Wei et al. ................ 361/56 |
| 5,721,439 | 2/1998 | Lin ......................... 257/204 |
| 5,733,794 | 3/1998 | Gilbert et al. ............ 437/45 |
| 5,946,573 | 8/1999 | Hsu . |
| 5,960,288 | 9/1999 | Hong et al. . |
| 5,985,722 | 11/1999 | Kishi . |

*Primary Examiner*—John F. Niebling
*Assistant Examiner*—Ron Pompey
*Attorney, Agent, or Firm*—George O. Saile; Stephen B. Ackerman

[57] ABSTRACT

In this invention a second gate is created in the area of the drain of a host transistor. The second gate overlies an N-well region and separates the drain of the host transistor into two portions. One portion of the drain is between the field oxide and the second gate and contains the contact for the drain. The second portion of the drain lies between the first gate which controls current in the drain and the second gate. The second gate provides a mask for the siliciding of the drain and provides a high impedance to drain current. In the event of an ESD, drain current is forced down into the N-well through one portion of the drain, under the second gate, and back up through the second portion of the drain providing a longer path and additional bulk material into which to dissipate the energy from an ESD event. Without using an extra mask to block the silicide, the second gate provides a silicide blocking effect to the drain of the ESD protection device.

6 Claims, 3 Drawing Sheets

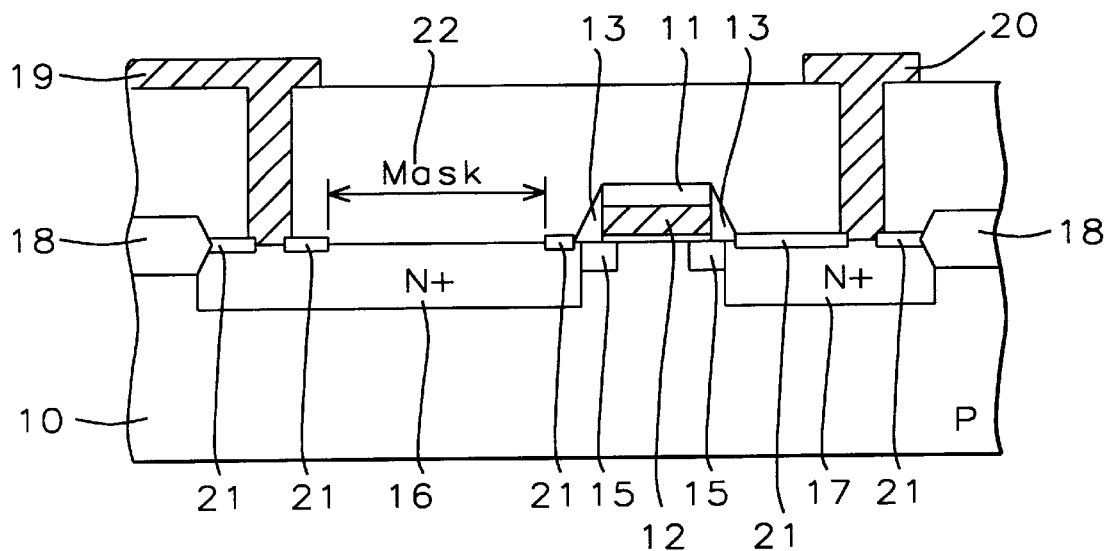
FIG. 1 – Prior Art
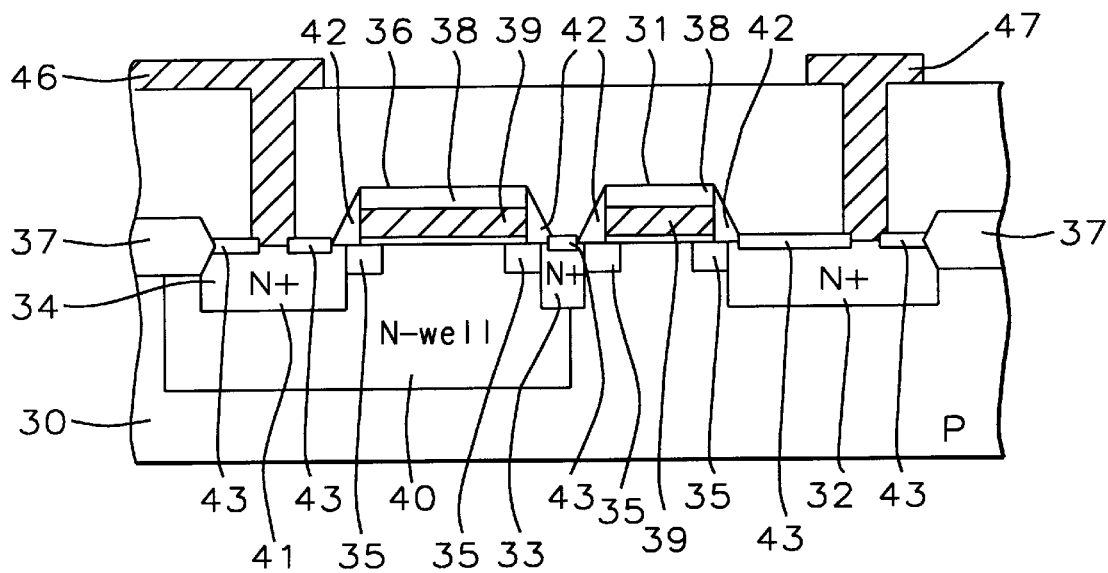
FIG. 2

FIG. 3 - Prior Art

FABRICATION OF ESD PROTECTION DEVICE USING A GATE AS A SILICIDE BLOCKING MASK FOR A DRAIN REGION

Background of the Invention

1. Field of Invention

This invention relates to semiconductor processing and in particular to fabricating ESD protection devices in a silicided CMOS process.

2. Description of Related Art

With the increase in the level of integration of semiconductor product device structures have shrunk leaving less volume of material to dissipate heating from current surges caused by electrostatic discharge (ESD). Making input and output devices large enough to dissipate the energy from an ESD uses valuable semiconductor real estate. Various attempts have been made to lengthen the path of the discharge current keeping the transistor devices small and providing a way to absorb the ESD energy.

In U.S. Pat. No. 5,733,794 (Gilbert et al.) an ESD protection transistor has a halo region of opposite conductivity from the source and drain. The halo region permits the ESD protection transistor to have a breakdown voltage adjusted so as to turn on before the device being protected is affected by an ESD. In U.S. Pat. No. 5,721,439 (Lin) is described an ESD protection transistor with a drain having a number of isolated islands evenly distributed throughout the drain diffusion region. The isolated islands providing uniform resistance of the drain suitable for providing ESD protection. In U.S. Pat. No. 5,719,733 (Wei et al.) a device for ESD protection uses a silicon controlled rectifier configuration with controllable triggering voltage, The ESD protection device is connected between ground and the I/O pin of the circuit to be protected.

In U.S. Pat. No. 5,629,544 (Voldman et al.) a diode in a well with a trench isolation is used for ESD protection. Both the well diode contacts are silicided and a gate structure is used to space the diode contact for the trench isolation edge. In U.S. Pat. No. 5,477,413 (Watt) an ESD protection circuitry is constructed in a P-well using a P-well with a diode for negative ESD voltages and a P-well with a multiple FET's for positive ESD voltages. Circuits for both the positive and negative ESD voltages connect the resulting current from an ESD event into a metal conduit. In U.S. Pat. No. 5,446,302(Beigel et al.) In U.S. Pat. No. 5,446,302 (Beigel et al.) a diode connected bipolar transistor device is disclosed that provides protection from ESD. The device functions as a transistor in the active region an ESD event with the current path from collector to emitter and lowering the ESD current density. In U.S. Pat. No. 5,440,162 (Worley et al.) an ESD protection circuit for pads of an integrated circuit using silicide-clad diffusions is described. The circuit uses a robust N+diode with an N-well block, an NFET and a transient clamp, each with a distributed N-well drain resistor to prevent avalanching and leakage. In U.S. Pat. No. 5,272,097 (Shiota) a process is described for forming diodes in a process which simultaneously forms MOS or CMOS devices. The diodes have a relatively low breakdown voltage, making them suitable for ESD protection devices. In U.S. Pat. No. 5,021,853 (Mistry) an ESD protection device is formed by an N-channel grounded gate transistor. The protection device has a polysilicon gate but there is no silicide on top of the gate or on the drain and source near the gate to minimize adverse effects of ESD events.

During an electrostatic discharge heating takes place in the area of the drain. This is a result of a junction breakdown at the drain junction which allows a large amount of current to flow. If the current is not spread out across a sufficiently large volume, the resulting heat will not be dissipated and damage to the device will result. As semiconductor devices are shrunk and integrated together in larger and larger quantities, the sensitivity to ESD becomes worse. A way is described in this invention allow small devices, permitting adequate dissipation of heat from an electrostatic discharge and reducing by one the number of masks required over prior art.

SUMMARY OF THE INVENTION

In this invention a second gate structure is created over an N-well located in the drain region of a host transistor and is used to produce a high impedance block to drain current of the host transistor thereby producing ESD protection to the host transistor. The second gate provides a mask to produce an opening in the siliciding of the drain surface to produce a block to drain current flowing through the surface of the drain with the silicide. The second gate structure is used to replace a masking step that masks a part of the drain region from siliciding, placing an impediment to the flow of drain current, and providing ESD protection. The block to drain current forces the drain current of the host transistor down into the N-well, spreading out and dissipating the associated heat from an electrostatic discharge into the semiconductor bulk and thereby providing ESD protection to the host transistor.

Below the second gate in the drain region of the host transistor is a lightly doped drain (LDD) formed over the N-well before sidewalls were added to the gate. After sidewalls are formed the heavily doped drain and source of the host device are formed with the heavily doped drain diffusing under the sidewalls on either side of the second gate into the N-well. The heavily doped drain and source diffuses under the sidewalls of the first gate of the host transistor as well.

The first and second gate structures comprise a layer of oxide covering a layer of polysilicon. In circuit operation the first gate is the controlling gate and the second gate is left floating or is tied off so as to create a high impedance to drain current that is flowing through the drain and the drain silicided surface. The drain current of the host transistor is forced to have an added path length into the bulk of the semiconductor substrate. The drain current path is from the drain contact down into the second portion of the drain, into the N-well, under the second gate and back up through the first portion of the drain to the channel under the first gate. The first portion of the drain is located between the first and second gates and the second portion containing the drain contact is located between the second gate and the field oxide bounding the area of the transistor. The added path length into the bulk material providing the capacity to absorb the heat dissipation resulting from an ESD event.

Although and N-channel device on a P-substrate has been described here, the structure and process described herein are applicable to a P-channel transistor on an N-substrate with the appropriate material type changed for the various semiconductor regions. This leads to a P-well, P+ drain, P+ source and P− LDD.

BRIEF DESCRIPTION OF THE DRAWINGS

This invention will be described with reference to the accompanying drawings, wherein:

FIG. 1 is a cross section view of a transistor of prior art with an opening in the silicided surface of the drain of the transistor providing ESD protection;

FIG. 2 is a cross section view of a host transistor with a second gate covering a portion of the drain of a host transistor to block direct flow of drain current and provide ESD protection;

DETAILED DESCRIPTION OF THE PREFERRED EMBODIMENT

Figure 3:
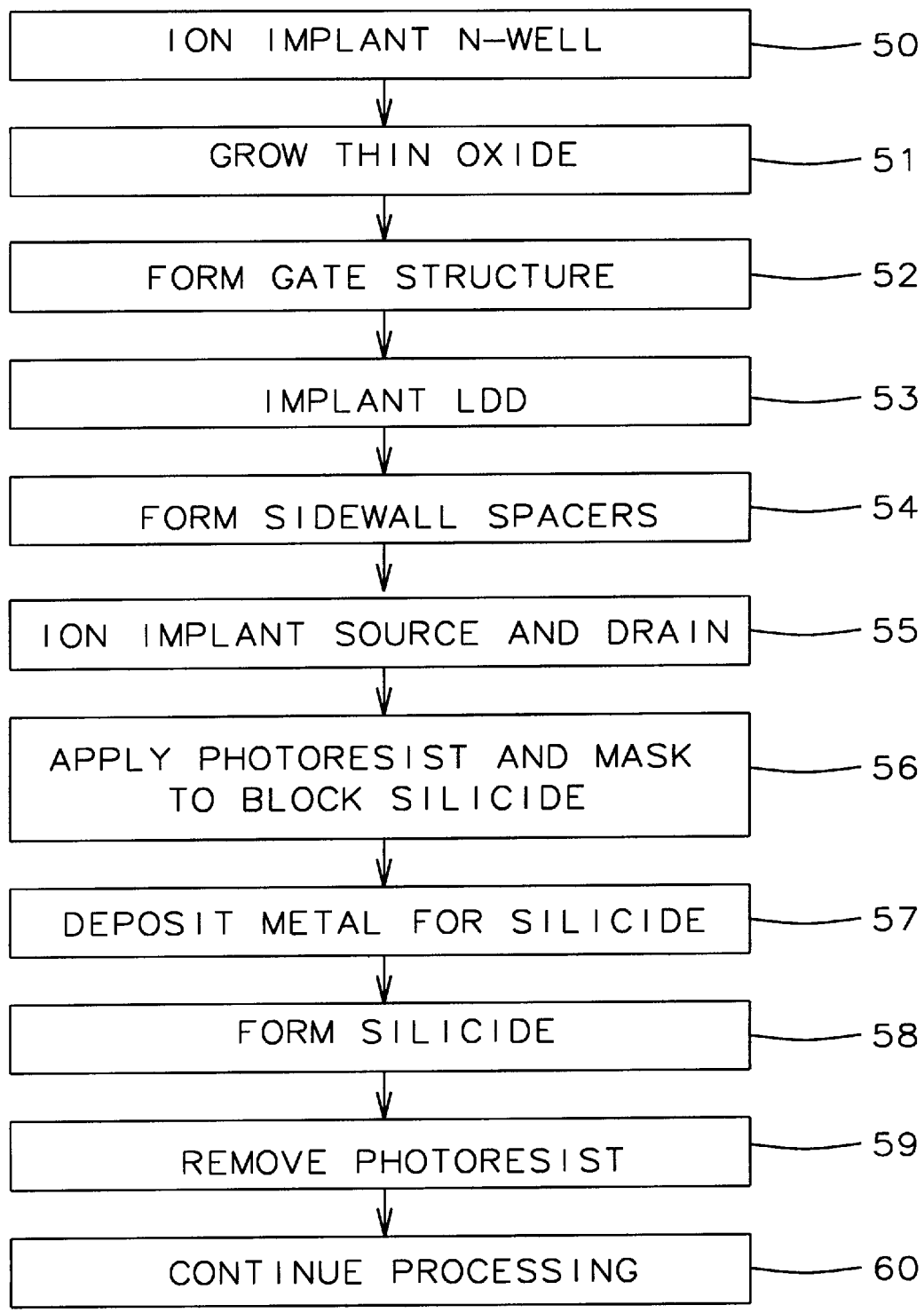
FIG. 3 is a flow diagram of a method used in prior art to produce an opening in the silicided surface of the drain of an ESD protected device.

In FIG. 1 is shown an N-channel transistor on a P substrate 10 of prior art with ESD protection. The gate structure of the transistor is constructed of a layer of oxide 11 covering a layer of polysilicon 12 and with side walls 13 extending from the surface of the substrate 10 to the layer of oxide 11. Underlying a portion of the gate structure is a lightly doped drain (LDD) 15, a drain 16 and a source 17. Metalization 19 connects to the drain 16, and metalization 20 connects to the source 17. On top of the exposed surfaces of the drain 16 and the source 17 is a silicide 21 except the masked area 22. The silicide being formed by depositing a metal of group VIII and then heating to form a silicide with the semiconductor surfaces. The area of the drain that is masked to not have a silicide 22 provides an impedance to the flow of ESD current, forcing the current to spread out and flow through the drain material 16. The path through the drain 16 provides bulk material dissipates heat from an ESD event.

FIG. 2 shows an N-channel transistor of this invention on a P substrate 30. A host transistor is formed by a first gate structure 31, an LDD 35, a source 32, and a drain 33 and 34, and having drain metalization 46 and source metalization 47. The drain is separated into a first portion 33 and a second portion 34 by a second gate 36. The first portion of the drain 33 lies between the first gate 31 and the second gate 36, and is bounded by field oxide 37 on either end. The second portion of the drain 34 lies between the second gate 36 and the field oxide 37, and contains the drain contact 41 to drain metalization 46. The first gate 31 and second gate 36 are comprised of a layer of oxide 38 over a layer of polysilicon 39. Side wall spacers 42 are formed on the sides of the first and second gates 31 and 36. The source 32 and drain 33 34 are coated with a metal of group VIII such as titanium, Ti, or cobalt, Co, and the substrate is heated to between about 500 to 600 degrees Celsius to form a silicide with the exposed semiconductor surfaces 43. The second gate 36 masks a portion of the drain area to prevent silicide formation under the second gate 36, and to provide a high impedance to the direct flow of drain current.

Continuing to refer to FIG. 2, underlying both portions of the drain 33 34, and the second gate 36 is an N-well 40. The second gate 36 is left floating or is biased off to provide a high impedance to the drain current. The N-well 40 provides a way for current to flow between the first and second portions of the drain 33 and 34. The path of the drain current is from the drain contact 41 down into the second portion of the drain 34, through the N-well 40, under the second gate 36, back up through the first portion of the drain 33 and to the channel under the first gate 31. The added path of the drain current into the bulk material of the substrate 30 provides capacity to dissipate the heat from an ESD event.

Continuing to refer to FIG. 2, the size of the second gate 36 approximately about 0.5 to 5μm in length and having a width that is the same as the device width, approximately about 200 to 500μm. The spacing of the second gate 36 from the first gate 31 is approximately about 0.1 to 3μm, and the spacing of the second gate 36 from the drain contact 41 is approximately about 0 to 3μm. The depth of the of the N-well 40 is approximately about 1 to 2 μm, and the depth of the drain 33 and 34 is approximately about 0.1 to 0.3 μm.

In FIG. 3 is shown a prior art process flow of the method to produce a silicide block to the flow of drain current and provide ESD protection. An N-well is ion implanted into a semiconductor substrate 50 and a thin oxide is grown over the surface of the substrate 51. A plurality of gate structures are formed with a layer of oxide covering a layer of polysilicon 52. An LDD is implanted into the substrate using the plurality of gates as a mask 53. Sidewall spacers are formed on the plurality of gates 54, and then the heavily doped drains and sources are ion implanted 55. Photo resist is applied to the surface of the substrate and a mask is applied to block the formation of silicide in the areas of ESD sensitivity 56. Metal to form silicide is deposited on the surface of the substrate 57, and the substrate is heated to form a silicide using the gate structures and field oxide as a mask 58. The photo resist is removed 59 and processing is continued 60.

Figure 4:
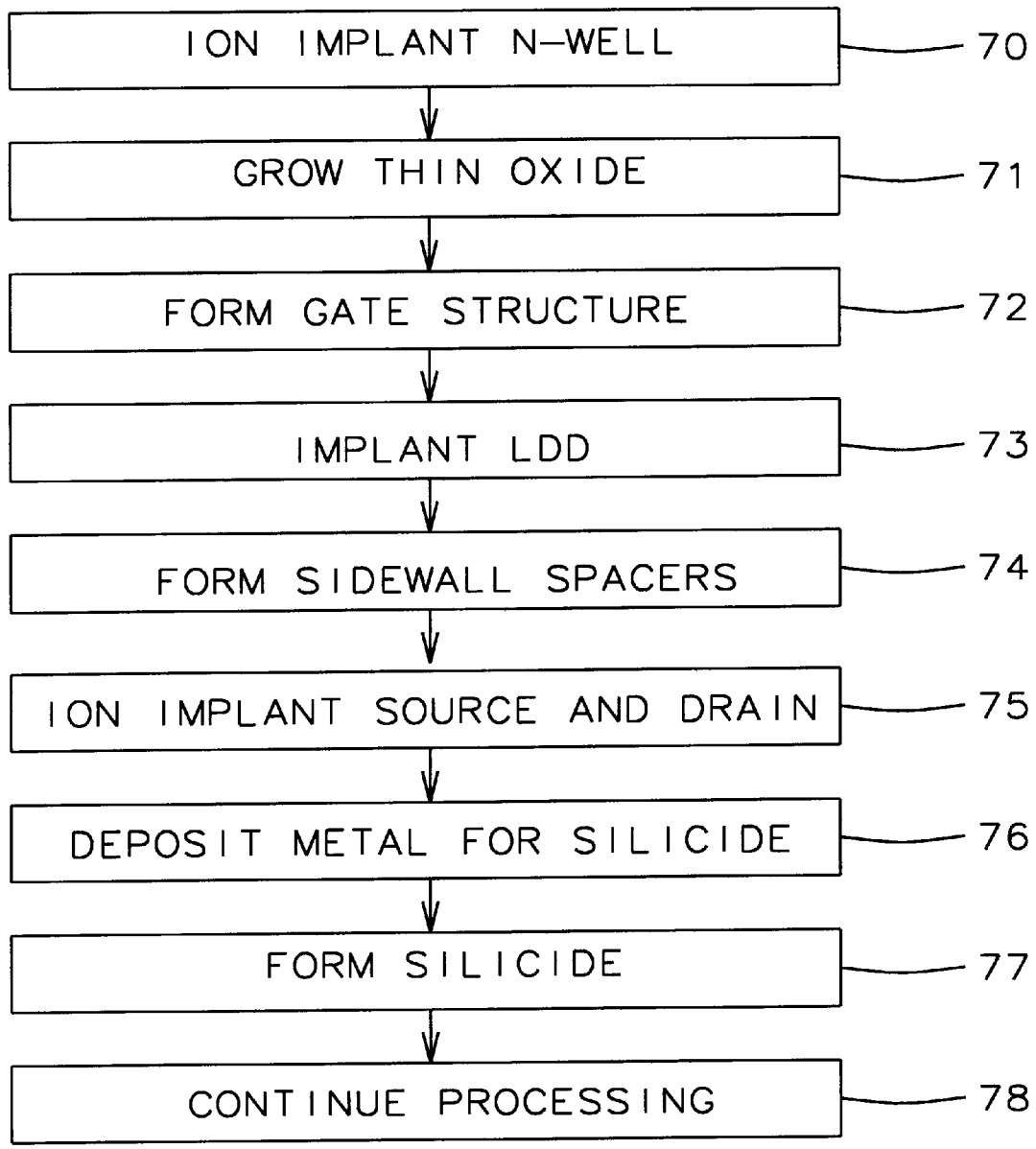
FIG. 4 is a flow diagram of the method used to place a second gate in the drain of a host transistor to provide ESD protection.

In comparison, the process flow of this invention is shown in FIG. 4 that eliminates the need for a mask to block the formation of silicide on a portion of the drain of an ESD protected transistor. An N-well is ion implanted into a semiconductor substrate 70, and then a thin layer of oxide is grown on the surface of the substrate 71. A plurality of gate structures are formed comprising a layer of oxide over a layer of polysilicon 72. The plurality of gates include the gates placed in a drain region of an ESD sensitive transistor to block the formation of silicide in a portion of the drain and provide a high impedance block to drain current. An LDD is ion implanted into the substrate using the plurality of gates as a mask 73; however, ion implanting an LDD can be left out of the process when it is not required. Next sidewall spacers are formed on the sides of the plurality of gates 74. The heavily doped source and drain are ion implanted using the plurality of gates and the field oxide as masks 75. A metal of group VIII such as titanium, Ti , or cobalt, Co is deposited on the surface of the substrate 76, and the substrate is heated to between about 500 to 600 degrees Celsius to form a silicide with the exposed semiconductor surfaces 77. The silicide masking step and photoresist removal step in the process of prior art shown in FIG. 3 are eliminated by using the gate structures as a mask for the siliciding process 77, and the process continues 78.

While the invention has been particularly shown and described with reference to preferred embodiments thereof, it will be understood by those skilled in the art that various changes in form and details may be made without departing from the spirit and scope of the invention.

What is claimed is:

1. A method for creating an ESD protection device, comprising:
   a) ion implanting an N-well which contains a drain region of an N-channel transistor on a P-type semiconductor substrate,
   b) growing a thin oxide over surface of said substrate,
   c) forming a first gate between source and drain of said transistor, and forming a second gate over said N-well wherein each gate has an insulator above a polysilicon electrode,
   d) ion implanting LDD using said first and second gates and field oxide as a mask, e) forming side wall spacers on sides of said first and second gates extending from surface of said substrate to said insulator, f) ion implanting heavily doped source and drain using said first and second gates and the field oxide as a mask, g) depositing metal on surface of said substrate, and h) forming a silicide with semiconductor surfaces.

2. A method for creating an ESD protection device, comprising:

a) ion implanting an N-well, which contains a drain region of an N-channel transistor on a P-type semiconductor substrate, b) growing a thin oxide over surface of said substrate, c) forming a first gate between source and drain of said transistor, and forming a second gate over said N-well wherein each gate has an insulator above a polysilicon electrode, d) forming side wall spacers on sides of said first and second gates extending from surface of said substrate to said insulator, e) ion implanting heavily doped source and drain using said first and second gates and the field oxide as a mask, f) depositing metal on surface of said substrate, and g) forming a silicide with semiconductor surfaces.

3. A method for creating an ESD protection device, comprising:

a) ion implanting a P-well, which contains a drain region of an P-channel transistor on a N-type semiconductor substrate, b) growing a thin oxide over surface of said substrate, c) forming a first gate between source and drain of said transistor, and forming a second gate over said N-well wherein each gate has an insulator above a polysilicon electrode, d) ion implanting LDD using said first and second gates and field oxide as a mask, e) forming side wall spacers on sides of said first and second gates extending from surface of said substrate to said insulator, f) ion implanting heavily doped source and drain using said first and second gates and the field oxide as a mask, g) depositing metal on surface of said substrate, and h) forming a suicide with semiconductor surfaces.

4. The method of claim 1, wherein forming said second gate over said N-well within drain area of said transistor creates an ESD protection device.

5. The method of claim 4, wherein forming said second gate over said N-well and within said drain area is done with a separation from said first gate and drain contact.

6. The method of claim 4, wherein forming said second gate extends full width of said drain bounded by said field oxide.

* * * * *